United States Patent
Li et al.

(10) Patent No.: US 12,446,317 B2
(45) Date of Patent: Oct. 14, 2025

(54) DRIVING SUBSTRATE AND DISPLAY DEVICE

(71) Applicant: HKC CORPORATION LIMITED, Shenzhen (CN)

(72) Inventors: Zeyao Li, Shenzhen (CN); Rongrong Li, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 393 days.

(21) Appl. No.: 18/208,892

(22) Filed: Jun. 13, 2023

(65) Prior Publication Data

US 2024/0145486 A1    May 2, 2024

(30) Foreign Application Priority Data

Oct. 31, 2022   (CN) .......................... 202211354800.4

(51) Int. Cl.
*H01L 33/62* (2010.01)
*H10D 86/40* (2025.01)
(Continued)

(52) U.S. Cl.
CPC ........... *H10D 86/60* (2025.01); *H10D 86/441* (2025.01); *H10H 20/857* (2025.01)

(58) Field of Classification Search
CPC .. H10H 20/857; H10H 20/831; H10H 20/813; H01L 25/0753; H01L 25/072;
(Continued)

(56) References Cited

U.S. PATENT DOCUMENTS 10,749,259 B2 * 8/2020 Misaki ................. H01Q 1/247
2010/0302221 A1   12/2010 Okumoto
(Continued)

FOREIGN PATENT DOCUMENTS

CN    107978622 A    5/2018
CN    108364976 A    8/2018
(Continued)

OTHER PUBLICATIONS

Chinese First Office Action, Chinese Application No. 202211354800.4, mailed Jul. 24, 2023 (13 pages).
(Continued)

*Primary Examiner* — Nikolay K Yushin

(57) ABSTRACT

The present disclosures provide a driving substrate and a display device. The driving substrate includes a base, a first metal layer and a second metal layer, and a connection layer. The first metal layer includes a first wiring and the second metal layer includes a second wiring. A part of the connection layer extends to the first through hole to form a first conductive hole and another part extends to second through hole to from a second conductive hole. A first conductive hole and a second conductive hole form a group of conductive connection holes. The current path formed by the first conductive hole passing through the connection layer to the corresponding second conductive hole is the intra-group
(Continued)

current path, while the current path formed by the first conductive hole passing through the connection layer to the second conductive hole in any other group is the extra-group path.

20 Claims, 7 Drawing Sheets

(51) Int. Cl.
*H10D 86/60* (2025.01)
*H10H 20/857* (2025.01)

(58) Field of Classification Search
CPC ..... H01L 25/18; H01L 25/07; H01L 25/0655; H10D 86/60; H10D 86/441; H10D 86/40
See application file for complete search history.

(56) References Cited

U.S. PATENT DOCUMENTS

| 2014/0209910 | A1 | 7/2014 | Kim |
| 2016/0071919 | A1 | 3/2016 | Chen |
| 2016/0252792 | A1 | 9/2016 | Han |
| 2017/0294160 | A1 | 10/2017 | Ono |
| 2018/0287254 | A1 | 10/2018 | Nakano |
| 2019/0173173 | A1* | 6/2019 | Misaki ................. H10D 86/441 |

FOREIGN PATENT DOCUMENTS

| CN | 110095889 | A | 8/2019 |
| CN | 112882295 | A | 6/2021 |
| CN | 112987351 | A | 6/2021 |
| CN | 113219739 | A | 8/2021 |
| CN | 113219740 | A | 8/2021 |
| CN | 113764384 | A | 12/2021 |
| CN | 115083362 | A | 9/2022 |
| CN | 115719747 | A | 2/2023 |
| CN | 218447918 | U | 2/2023 |
| JP | 2000357584 | A | 12/2000 |
| WO | 2015163719 | A1 | 10/2015 |

OTHER PUBLICATIONS

Notification to Grant Patent Right for Invention, Chinese Application No. 202211354800.4, mailed Aug. 15, 2023 (6 pages).
International Search Report, International Application No. PCT/CN2023/102169, mailed Oct. 7, 2023 (21 pages).

* cited by examiner

DRIVING SUBSTRATE AND DISPLAY DEVICE

This application claims priority to Chinese Patent Application No. 202211354800.4, filed Oct. 31, 2022, titled "driving substrate and display device", which is herein incorporated by reference in its entirety.

TECHNICAL FIELD

The present disclosure relates to the field of display technologies, and in particular to a driving substrate and a display device.

BACKGROUND

Inorganic micro light emitting diode (Micro LED) display devices are one of the hotspots in the field of display device research today. Compared with organic light emitting diode (OLED) display devices, the Micro LED display devices have advantages such as high reliability, low power consumption, high brightness, and fast response speed, etc.

Due to the fact that light-emitting components of a display device are current driven, the design of the signal line of a driving substrate that provides current to the light-emitting components must consider problems of voltage drop (IR Drop) and current density. In the related art, in the process of designing the circuit wiring of the driving substrate, due to the presence of cross wires, there is inevitably a layer transition through hole for a signal line. In other words, a first metal wiring on the driving substrate is transferred to a second metal wiring through a conductive hole and a connection layer, such that current may be transmitted from the first metal wiring through the conductive hole and the connection layer to the second metal wiring. To reduce the voltage drop during signal transmission and the current density on the transmission path, multiple conductive holes are usually arranged such that the current may be dispersed through multiple conductive holes for transmission, in order to reduce the current density and voltage drop.

However, in the existing layout design of multiple conductive holes on the driving substrate, the current is mainly concentrated in a portion of the conductive holes and transmitted along the connection layer to another metal wire. Only a small portion of the current passes through other conductive holes, resulting in excessive concentration and density of the current on the connection layer, leading to an increase in voltage drop along the path, which may easily cause the problems of burning of the electrical connection structure at that location due to high temperature.

SUMMARY

In one aspect, a technical solution provided in the present disclosure is a driving substrate. The driving substrate includes a base, a first metal layer, a first insulation layer, a second metal layer, a second insulation layer, and an connection layer. The first metal layer is arranged on one side of the base, and the first metal layer includes a first wiring. The first insulation layer is arranged on one side of the first metal layer away from the base and covers the first metal layer. The second metal layer is arranged on one side of the first insulation layer away from the base, and the second metal layer includes a second wiring. The second insulation layer is arranged on one side of the second metal layer away from the base and covers the second metal layer. The first insulation layer and the second insulation layer define a first through hole to expose a part of the first wiring. The second insulation layer defines a second through hole to expose a part of the second wiring. The connection layer is arranged on one side of the second insulation layer away from the base. A part of the connection layer extends into the first through hole to form a first conductive hole, and another part of the connection layer extends into the second through hole to form a second conductive hole to allow the electrical connection of the first wiring and second wiring through the connection layer. One first conductive hole and one second conductive hole form a group of conductive connection holes. The driving substrate includes multiple groups of conductive connection holes, each group of conductive connection holes having an intra-group current path and an extra-group path. In each group of conductive connection holes, the current path formed by the first conductive hole passing through the connection layer to the corresponding second conductive hole is the intra-group current path. In any group of the conductive connection holes, the current path formed by the first conductive hole passing through the connection layer to the second conductive hole of the other group of conductive connection holes is the extra-group path. The length of the intra-group current path in each group of conductive connection holes is smaller than the length of the extra-group path. And the length of the intra-group current path of one group of conductive connection holes is equal to the length of the intra-group current path of any other group of conductive connection holes.

In another aspect, another technical solution adopted in the present disclosure is to provide a display device. The display device includes a light emitting unit and a driving substrate. The light emitting unit is used for displaying images. The light emitting unit includes a current driven light emitting element. The driving substrate is electrically connected to the light emitting unit for providing a driving signal to the light emitting unit, and the driving substrate is the driving substrate related to the above technical solution.

BRIEF DESCRIPTION OF THE DRAWINGS

In order to provide a clearer explanation of the technical solution in the embodiments of the present disclosure, a brief introduction will be given to the accompanying drawings required in the description of the embodiments. It is evident that the accompanying drawings in the following description are only some embodiments of the present disclosure. For ordinary technical personnel in the art, other accompanying drawings may be obtained based on these drawings without creative labor.

REFERENCE NUMERALS

Figure 1:
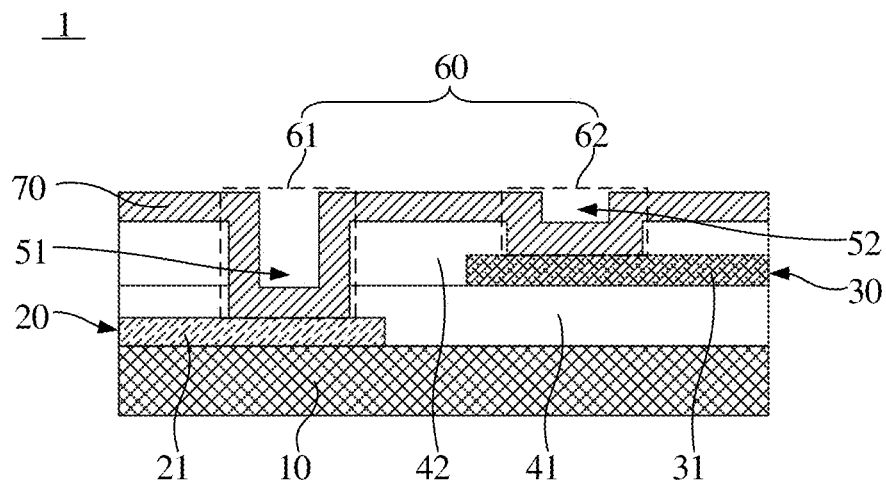
FIG. 1 is a cross-sectional structural view of a driving substrate provided in an embodiment of the present disclosure.

1—Driving substrate; 10—Substrate; 20—First metal layer; 21—First wiring; 211—First body portion; 212—First extension portion; 30—Second metal layer; 31—Second wiring; 311—Second body portion; 312—Second extension portion; 41—First insulation layer; 42—Second insulation layer; 51—First through-hole; 52—Second through-hole; 60—Conductive connection hole; 61—First conductive hole; 62—Second conductive hole; 70—connection layer; 22—Third wiring; 32—Fourth wiring; 53—Third through-hole; 54—Fourth through-hole; 63—Third conductive hole; 64—Fourth conductive hole; 80—connection layer; 2—Display unit; 201—Light emitting device; 100—Display device.

DETAILED DESCRIPTION

The following will provide a clear and complete description of the technical solution in the embodiments of the present disclosure in conjunction with the accompanying drawings. Obviously, the described embodiments are only a part of the embodiments of the present disclosure, not all of them. Based on the embodiments in the present disclosure, all other embodiments obtained by ordinary technical personnel in this field without creative efforts fall within the protection scope of the present disclosure.

The terms "first," "second," and "third" in the present disclosure are only used for descriptive purposes and cannot be understood as indicating or implying relative importance or implying the quantity of technical features indicated. Therefore, features limited to "first", "second", and "third" may explicitly or implicitly include at least one of these features. In the description of the present disclosure, "multiple" means at least two, such as two, three, etc., unless otherwise specified. All directional indications (such as up, down, left, right, front, back . . . ) in the embodiments of the present disclosure are only used to explain the relative position relationship, motion situation, etc. between components in a specific posture (as shown in the drawings). If the specific posture changes, the directional indication also changes accordingly. In addition, the terms "including" and "having", as well as any variations of them, are intended to cover non-exclusive inclusions. For example, a process, method, system, product, or device that includes a series of steps or units is not limited to the listed steps or units, but optionally includes steps or units that are not listed, or optionally includes other steps or units that are inherent to the process, method, product, or device.

The reference to "embodiment" in this article means that specific features, structures, or characteristics described in conjunction with the embodiments may be included in at least one embodiment of the present disclosure. The phrase appearing in various parts of the specification does not necessarily refer to the same embodiment, nor is it an independent or alternative embodiment that is mutually exclusive with other embodiments. Technicians in this field explicitly and implicitly understand that the embodiments described in this text may be combined with other embodiments.

The following provides a detailed description of the present disclosure in conjunction with the accompanying drawings and embodiments.

Figure 11:
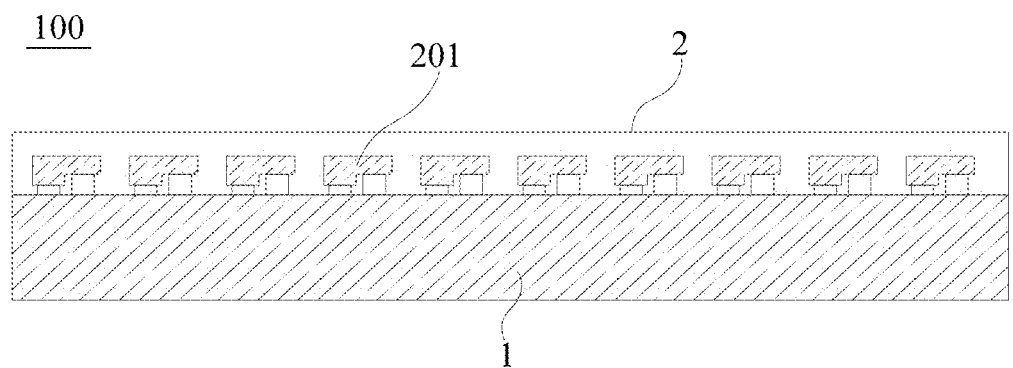
FIG. 11 is a schematic structural view of the display device provided in an embodiment of the present disclosure.

As shown in FIG. 1, FIG. 1 is a cross-sectional structural view of the driving substrate provided in an embodiment of the present disclosure. In the present embodiment, a driving substrate 1 is provided. The driving substrate 1 may be used for the display device 100 (as shown in FIG. 11) to provide a current driving signal to the light emitting unit of the display device 100, so as to enable the light emitting unit to emit light. Specifically, the driving substrate 1 includes a base 10, a first metal layer 20, a first insulation layer 41, a second metal layer 30, a second insulation layer 42, and a connection layer 70 arranged in sequence.

the base 10 may be plate-shaped, and the shape and size of the base 10 may be arranged according to actual production needs. For example, the size, shape, and material of the base 10 of the driving substrate 1 may be arranged based on factors such as the size of the display area and the shape of the display panel. the base 10 may be a flexible substrate or a hard substrate. Specifically, the base 10 may be made of insulating materials, such as glass, resin, organic polymer material, etc. the base 10 may also be made of metal material, and an insulation layer needs to be formed on the metal substrate to avoid short circuits with other metal layers on the driving substrate 1.

The first metal layer 20 is arranged on one side of the base 10, and the first metal layer 20 includes a first wiring 21. Specifically, the first metal layer 20 may be patterned to form the first wiring 21. The first wiring 21 is used for transmitting signals, such as voltage signals or current signals. The material and thickness of the first metal layer 20 may be selected according to practical needs, and the length, width, shape, and direction of the first wiring 21 may be designed and selected according to practical needs.

The first insulation layer 41 is arranged on one side of the first metal layer 20 away from the base 10, and covers the first metal layer 20 so as to isolate the first metal layer 20, thus avoiding abnormal wiring resulted from short circuits between the first metal layer 20 and other signal wiring. The material and thickness of the first insulation layer 41 may be arranged according to practical needs, which are not limited herein.

The second metal layer 30 is arranged on one side of the first insulation layer 41 away from the base 10, and the second metal layer 30 includes a second wiring 31. Similar to the first wiring 21, the second metal layer 30 may be patterned to form the second wiring 31. The second wiring 31 is used for transmitting signals, such as voltage signals or current signals. Similarly, the material and thickness of the second metal layer 30 may be selected according to practical needs, and the length, width, shape, and direction of the second wiring 31 may be designed and arranged according to practical needs.

The second insulation layer 42 is arranged on one side of the second metal layer 30 away from the base 10, and covers the second metal layer 30 so as to isolate the second metal layer 30, thus avoiding abnormal wiring resulted from short circuits between the second metal layer 30 and other signal wiring. Similarly, the material and thickness of the first insulation layer 41 may also be selected according to practical needs, which are not limited herein.

The first insulation layer 41 and the second insulation layer 42 define a first through hole 51. The first through hole 51 runs through the second insulation layer 42 and the first insulation layer 41 to expose a part of the first wiring 21. The second insulation layer 42 defines a second through hole 52. The second through hole 52 runs through the second insulation layer 42 to expose a part of the second wiring 31.

Further, a connection layer 70 is arranged on one side of the second insulation layer 42 away from the base 10. A part of the connection layer 70 extends to the first through hole 51 to form a first conductive hole 61, and another part of the connection layer 70 extends to the second through hole 52 to form a second conductive hole 62, such that the first wiring 21 and the second wiring 31 are electrically connected through the connection layer 70, thereby achieving signal transmission between the first wiring 21 and the second wiring 31. The specific signal transmission path may be as follows: first wiring 21→first conductive hole 61→connection layer 70→second conductive hole 62→second wiring 31. Alternatively, the specific signal transmission path may be as follows: second wiring 31→second conductive hole 62→connection layer 70→first conductive hole 61→first wiring 21. The connection layer 70 is specifically made of conductive materials, such as metal materials or indium tin oxide (ITO) materials, thus electrical connection between the first wiring 21 and the second wiring 31 may be achieved. The specific material selection of the connection layer 70 may be based on practical needs, which are not limited herein. In the present embodiment, the ITO material connection layer 70 is preferred.

Figure 2:
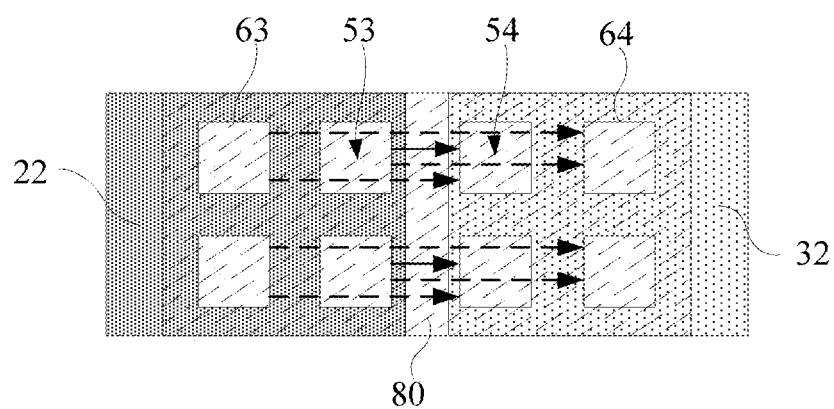
FIG. 2 is a schematic structural view of the arrangement structure of the conductive connection holes provided in a first comparative embodiment of the present disclosure.

As shown in FIG. 2, which is a schematic structural view of the arrangement the of conductive through holes provided in the first comparative embodiment of the present disclosure. Similar to the embodiments of the present disclosure, the first comparative embodiment provides a base, including a base (not shown in FIG. 2), a third metal layer (not shown in FIG. 2), a third insulation layer (not shown in FIG. 2), a fourth metal layer (not shown in FIG. 2), a fourth insulation layer (not shown in FIG. 2), and a connection layer 80. The structure of the base is similar to the structure of the driving substrate 1 of the embodiments of the present disclosure, which is not specifically introduced herein and the previous introduction may be referred for details. The third metal layer includes a third wiring 22, the fourth metal layer includes a fourth wiring 32, a third through hole 53 runs through the fourth insulation layer and the third insulation layer to expose a part of the third wiring 22, the fourth through hole 54 runs through the fourth insulation layer to expose a part of the fourth wiring 32. A part of the connection layer 80 extends into the third through hole 53 to form a third conductive through hole 63, another part of the connection layer 80 extends into the fourth through hole 54 to form a fourth conductive through hole 64, thereby enabling the third wiring 22 and the fourth wiring 32 to be electrically connected through the connection layer 80.

The multiple third through holes 53 are arranged in an array of multiple rows and multiple columns. The fourth through hole 54 is arranged on one side of the third through hole 53. The number of the fourth through hole 54 is the same as the number of the third through hole 53, and the arrangement of multiple fourth through holes 54 is similar to the arrangement of the third through hole 53, which is also an array of multiple rows and multiple columns. In the present embodiment, taking the third through holes 53 and the fourth through holes 54 arranged in the array of two rows and two columns as an example, due to the characteristic that current transmission selects the shortest path, the current will be concentrated on the paths between the two closest pairs of third through holes 53 and fourth through holes 54 (as shown by the solid arrow in FIG. 2). However, there is only a small, even no amount, of current passing through the relatively far away paths between the other third through holes 53 and the fourth through holes 54 (as shown by the dashed arrow in FIG. 2). Therefore, it may be considered that only two pairs of the third through holes 53 and the fourth through holes 54 are effective through holes, playing the main role in current transmission, while the other third through holes 53 and fourth through holes 54 have a relatively weak effect on current transmission and may be considered as ineffective through holes. As a result, the two pairs of third through holes 53 and fourth through holes 54 need to transmit more current. The current is more concentrated and dense in the transmission path between these two pairs of third through holes 53 and fourth through holes 54, leading to an increase in voltage drop on those paths. Furthermore, it may cause the temperature of the connection layer 80 to be too high, increasing the risk of burning the connection layer 80 or other wiring, components, etc. near this position. Therefore, it is necessary to redesign the layout of the third through holes 53 and the fourth through holes 54 to address the aforementioned technical issue.

Figure 3:
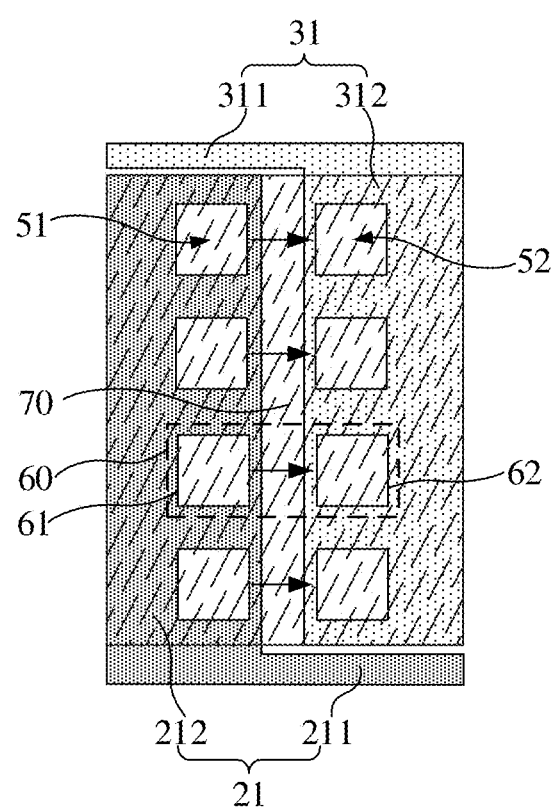
FIG. 3 is a schematic structural view of the arrangement structure of the conductive connection holes provided in a first embodiment of the present disclosure.

As shown in FIG. 3, FIG. 3 is a schematic structural view of the arrangement of the conductive connection holes provided in the first embodiment of the present disclosure. In the present embodiment, a first conductive hole 61 and a second conductive hole 62 form a group of conductive connection holes 60. The driving substrate 1 includes multiple groups of conductive connection holes 60 to evenly distribute current on the transmission path between the first conductive hole 61 and the second conductive hole 62 of each group, thereby reducing current density on the transmission path and further reducing voltage drop on the transmission path.

Specifically, each group of conductive connection holes 60 has an intra-group current path and an extra-group path. The intra-group current path is: in each group of conductive connection holes 60, the first conductive hole 61 passes through the connection layer 70 to the corresponding second conductive hole 62 to form a current path, that is, in each group of conductive connection holes 60, current passes from the first conductive hole 61 through the connection layer 70 to the second conductive hole 62. The extra-group path is: a current path formed by the first conductive hole 61 in one group of conductive connection holes 60 passing through the connection layer 70 to the second conductive hole 62 in any other group of conductive connection holes 60, that is, the current passes through the first conductive hole 61 in any one group of conductive connection holes 60 through the connection layer 70 to the second conductive hole 62 in any other group of conductive connection holes 60.

In specific embodiments, in each group of conductive connection holes 60, the length of the intra-group current path is smaller than the length of the extra-group current path, in order to form a shortest path between the first conductive hole 61 and the second conductive hole 62 in each group of conductive connection holes 60. As a result, the current is transmitted from the first wiring 21 along the shortest path to the second wiring 31, effectively shortening the current transmission path and reducing the load on the current transmission path, further reducing voltage drop on the current transmission path.

Further, among multiple groups of conductive connection holes 60, the length of the intra-group current path of one group of conductive connection holes 60 is equal to the length of the intra-group current path of any other group of conductive connection holes 60. In other words, the length of the first conductive hole 61 in each group of conductive connection holes 60 passing through the connection layer 70 to the second conductive hole 62 is all equal, such that the current may be evenly distributed on the transmission path between the first conductive hole 61 and the second conductive hole 62 in each group, enabling the first conductive hole 61 and second conductive hole 62 in each group to effectively transmit current. Therefore, the utilization rate of the conductive holes is effectively improved, which effectively disperses the current, reduces the current density on the transmission path, and increases the width of the current transmission path. Further, it reduces the load on the circuit transmission path at that position, and further reduces the voltage drop on the transmission path, thereby effectively avoiding the high temperature of the connection layer 70 and reducing the risk of burning out the connection layer 70 or other wiring, components, etc. near this location.

Specifically, the first wiring 21 includes a first body portion 211 and a first extension portion 212. One end of the first extension portion 212 is connected to the first body portion 211, and the first extension portion 212 corresponds to multiple first through-holes 51. In other words, the first through-hole 51 exposes a part of the first extension portion 212, and multiple first through-holes 51 are arranged in line along the extension direction of the first extension portion 212. The second wiring 31 includes a second body portion 311 and a second extension portion 312. One end of the second extension portion 312 is connected to the second body portion 311. The projection of the second extension portion 312 on the first metal layer 20 is staggered with the first extension portion 212. In other words, the projection of the second extension portion 312 on the first metal layer 20 does not overlap with the first extension portion 212. The second extension portion 312 corresponds to multiple second through holes 52. A portion of the second extension portion 312 is exposed. The multiple second through holes 52 are arranged in line along the extension direction of the second extension portion 312 and are respectively aligned to the multiple first through holes 51 one-to-one, such that each first conductive hole 61 and the corresponding second conductive hole 62 form a group of conductive connection holes 60, and the intra-group current path within each group of conductive connection holes 60 is equal.

The shapes of the first extension portion 212 and the second extension portion 312 may be rectangular, wavy-stripped or bent-stripped, etc., which may be arranged according to practical needs. Multiple first through holes 51 are arranged in line along the extension direction of the first extension portion 212, that is, the extension direction of the line connecting the multiple first through holes 51 is the same as the extension direction of the first extension portion 212. Similarly, multiple second through holes 52 are arranged in line along the extension direction of the second extension portion 312, that is, the extension direction of the line connecting the multiple second through holes 52 is the same as the extension direction of the second extension portion 312. For the convenience of arrangement and production, in the present embodiment, the first extension portion 212 and the second extension portion 312 are arranged as rectangles, multiple first through holes 51 are arranged in the same direction as the extension direction of the first extension portion 212, multiple second through holes 52 are arranged in the same direction as the extension direction of the second extension portion 312, and multiple first through holes 51 and multiple second through holes 52 are arranged in an array. Thus, in the column direction of the array, the second conductive holes 62 and the first conductive holes 61 located in the same column form a group of conductive connection holes 60. In other words, multiple first through holes 51 may be arranged in a row at equal intervals, and multiple second through holes 52 may also be arranged in a row at equal intervals and parallel to the first through holes 51 in the row. The spacing distance between the first through hole 51 and the spacing distance between the second through hole 52 is the same, and each second through hole 52 directly faces a first through hole 51, such that each group of first conductive holes 61 and second conductive holes 62 are arranged opposite to each other to form a group of conductive connection holes 60. Thus, the intra-group current path of each group of conductive connection holes 60 is equal, and the current may be evenly distributed on the transmission path between the first conductive hole 61 and second conductive hole 62 in each group. Therefore, the first conductive hole 61 and the second conductive hole 62 in each group may effectively transmit current, effectively improving the utilization rate of the conductive holes, effectively dispersing current, and effectively reducing the current density on the transmission path. And by increasing the width of the current transmission path, the load on the circuit transmission path at this location is further reduced, which may further reduce the voltage drop on the transmission path and effectively reduce the risk of burning out other wiring, components, etc. at or near this location due to high temperature of the connection layer 70.

The first through holes 51 and the second through holes 52 are both square or rectangular holes, and a group of opposite lines on the edge of the first through hole 51 and a group of opposite lines on the edge of the second through hole 52 are parallel to the direction of the array row. The other group of opposite lines on the edge of the first through hole 51 and the other group of opposite lines on the edge of the second through hole 52 are parallel to the direction of the array column. Specifically, the size of the first through hole 51 and the second through hole 52 may be selected according to practical needs. The shape and size of the first through hole 51 and the shape and size of the second through hole 52 may be the same or different, which may also be made according to practical needs. In the present embodiment, the shape and size of the first through hole 51 and the second through hole 52 are the same to facilitate production and reduce process complexity. At the same time, the shape and size of the first through hole 51 and the second through hole 52 are the same, such that in each group of the conductive connection holes 60, the line of the first through hole 51 near the second through hole 52 and the line of the second through hole 52 near the first through hole 51 may be aligned at both ends, thereby increasing the width of the intra-group current path of each group of conductive connection holes 60 and making the current distribution more balanced on the intra-group current path of each group of conductive connection holes 60, further dispersing the current, reducing current density and voltage drop.

Specifically, the number of the conductive connection holes 60 may be arranged according to practical needs, such as 2 groups, 4 groups, 6 groups, 8 groups, 12 groups, 15 groups, 18 groups, 20 groups, etc., which are not limited herein. In the present disclosure, for the convenience of comparing to the comparative embodiment in FIG. 2, taking four groups of conductive connection holes 60 as an example, four first conductive holes 61 are arranged in a row at equal intervals along the extension direction of the first extension 212, and four second conductive holes 62 are arranged in a row at equal intervals along the extension direction of the second extension 312. The spacing distance between adjacent first conductive holes 61 and the spacing distance between adjacent second conductive holes 62 is the same, resulting in the four first conductive holes 61 and four second conductive holes 62 arranged in an array of two rows and four columns. In the direction of the columns, the second conductive hole 62 and the adjacent first conductive hole 61 in the same column form a group of conductive connection holes 60, such that the length of the intra-group current path of each conductive connection holes 60 is equal. In other words, in each column, the current path from each first conductive hole 61 to the adjacent second conductive hole 62 through the connection layer 70 is the same and the shortest, such that the intra-group current path passing through each group of conductive connection holes 60 have the same current transmission effect, and the current is evenly distributed and flows through each group of conductive connection holes 60. Compared to the first comparative embodiment, the current transmitted by each group of conductive connection holes 60 in the present embodiment is only ½ of the effective through hole transmission current in the first comparative embodiment, and the width of the current transmission path on the connection layer 70 is twice the width of the current transmission path on the connection layer 70 in the first comparative embodiment. In other words, the load on the transmission path is ½ of the load in the first comparative embodiment, the current density and voltage drop on the current transmission path on the connection layer 70 are ½ of those in the first comparative embodiment, thus the voltage drop is ¼ of those in the first comparative embodiment. It indicates that the current density and voltage drop on the current path at the cross line structure on the driving substrate may be effectively reduced in the embodiments of the present disclosure, thereby effectively avoiding excessive temperature at the cross line position and reducing the routing of the connection layer 70 or the risk of other wiring and components near the connection layer 70 being burned.

Figure 4:
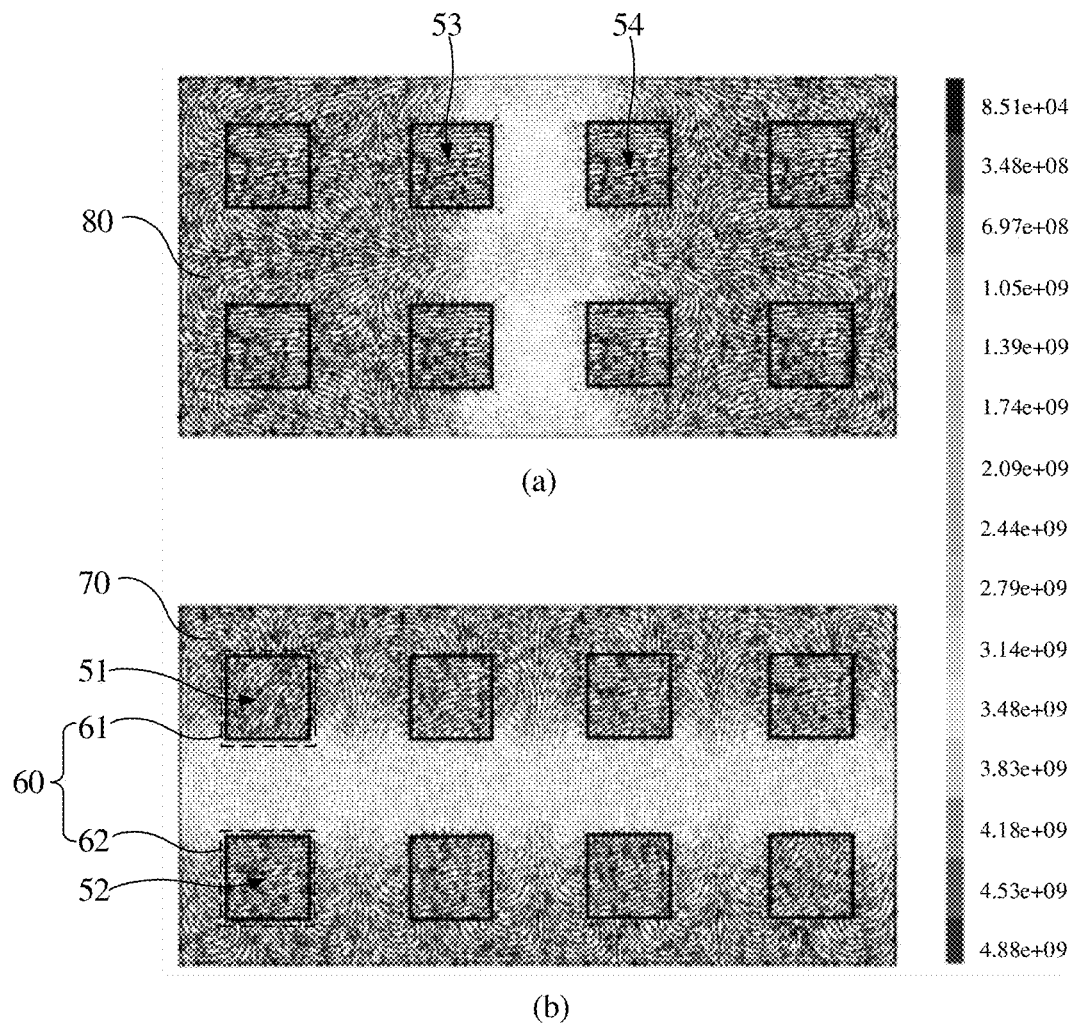
FIG. 4 is a simulation view of the current distribution in the first comparative embodiment and the first embodiment of the present disclosure; FIG. (a) is a simulation view of the current distribution in the first comparative embodiment of the present disclosure; FIG. (b) is a simulation view of the current distribution in the first embodiment of the present disclosure.

As shown in FIG. 4, FIG. 4 is a simulation view of the current distribution in the first comparative embodiment and the first embodiment of the present disclosure. FIG. (a) is a simulation view of the current distribution in the first comparative embodiment of the present disclosure, and FIG. (b) is a simulation view of the current distribution in the first embodiment of the present disclosure. A same amount of current is applied to the simulation in the first comparative embodiment and the present embodiment respectively. As shown in FIG. (a), in the first comparative embodiment, the current transmission is mainly concentrated between the two closest groups of third through hole 53 and fourth through hole 54, resulting in a higher current density on the transmission path. From FIG. (b), it may be seen in the present embodiment that, the current is relatively evenly transmitted between the first conductive hole 61 and the second conductive hole 62 in each group of conductive connection holes 60, indicating that the width of the transmission path is wider, and the current density on the transmission path is also smaller. It may be seen from the simulation results that the arrangement of the conductive connection holes 60 in the embodiments of the present disclosure may effectively reduce current density and voltage drop on the current path at the cross line transition position on the driving substrate 1, thereby effectively avoiding excessive temperature at the cross line transition position and reducing the risk of burning out the connection layer 70 or other wiring, components, etc. near this location.

Figure 5:
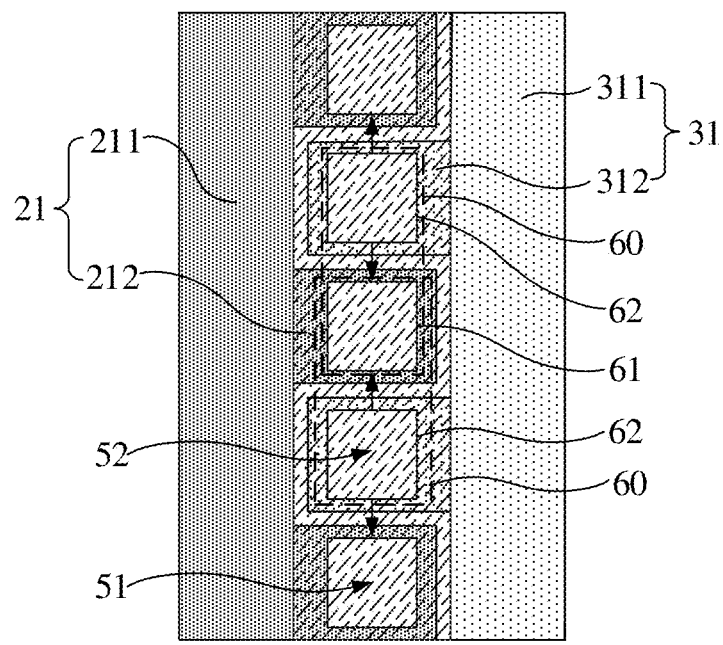
FIG. 5 is a schematic structural view of the arrangement of the conductive connection holes provided in a second embodiment of the present disclosure.
Figure 6:
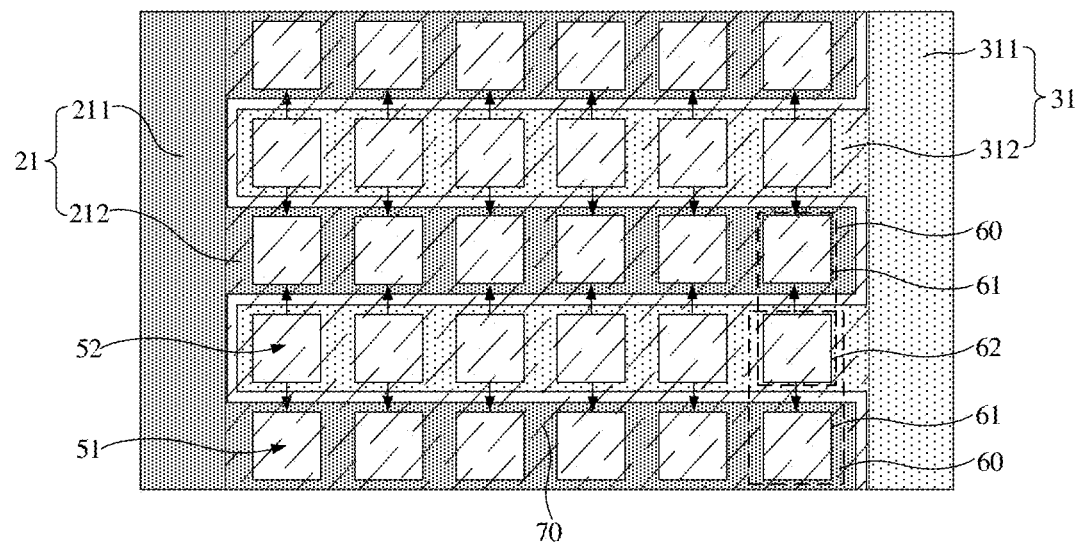
FIG. 6 is a schematic structural view of the arrangement of the conductive connection holes provided in a third embodiment of the present disclosure.

As shown in FIG. 5 and FIG. 6, FIG. 5 is a schematic structural view of the arrangement of the conductive connection holes provided in the second embodiment of the present disclosure, and FIG. 6 is a schematic structural view of the arrangement of the conductive connection holes provided in the third embodiment of the present disclosure. In the second embodiment and the third embodiment, the first wiring 21 includes a first body portion 211 and multiple spaced first extension portion 212. One end of the first extension portion 212 is connected to the first body portion 211, which means that the ends of the multiple first extension portions 212 are connected via the first body portion 211. Each first extension portion 212 corresponds to at least one first through hole 51, that is, each first extension portion 212 has at least one first through hole 51 to expose a part of the first extension portion 212, such that a part of the connection layer 70 extends into the first through hole 51 to form a first conductive hole 61, thereby being electrically connected to the first extension portion 212. The second wiring 31 includes a second body portion 311 and multiple spaced second extension portions 312. One end of the second extension portion 312 is connected to the second body portion 311, which means that the ends of the multiple second extension portions 312 are connected via the second body portion 311. Each second extension portion 312 corresponds to at least one second through hole 52, that is, each second extension portion 312 has at least one second through hole 52 to expose a part of the second extension portion 312, so as to extend another part of the connection layer 70 into the second through hole 52 to form a second conductive hole 62, thereby being electrically connected to the second extension portion 312. And the projection of the second extension portion 312 on the first metal layer 20 is arranged alternately with the first extension portion 212 and parallel to each other. The first through holes 51 and the second through holes 52 are arranged along the arrangement direction of the first extension portion 212 and the second extension portion 312 to form at least one column. The first through hole 51 forms the first conductive hole 61, and the second through hole 52 forms the second conductive hole 62. Therefore, the first conductive hole 61 and the adjacent second conductive hole 62 in the same column form a group of conductive connection holes 60, and the length of the intra-group current path of each conductive connection holes 60 is equal.

In the first through holes 51 and the second through holes 52 of the same row, the first through hole 51 has two adjacent second through holes 52. Therefore, the first conductive hole 61 formed by the first through hole 51 may form two groups of conductive connection holes 60 respectively with the two second conductive holes 62 formed by the adjacent two second through holes 52. In other words, the two groups of conductive connection holes 60 may share the same first through hole 51. The current is transmitted from two sides of the same first conductive hole 61 to the second conductive holes 62 in two groups of conductive connection holes 60 through the connection layer 70, and then to the second wiring 31 through the two second conductive holes 62. Similarly, the second through hole 52 may also have two adjacent first through holes 51, such that the second conductive hole 62 formed by the second through hole 52 may form two groups of conductive connection holes 60 respectively with two first conductive hole 61 formed by the two adjacent first through holes 51. The two groups of conductive connection holes 60 share one second through hole 52, and the current flows from the first conductive holes 61 in the two groups to two sides of the same second conductive hole 62 through the connection layer 70, then transmit from two sides of the same second conductive hole 62 to the second wiring 31 through the second conductive hole 62. In other words, by sharing the first through hole 51 or the second through hole 52 to form a conductive connection hole 60, the utilization rate of the first through hole 51 and the second through hole 52 may be improved, the current transmission efficiency may be improved, and the current density and voltage drop on the current path at the cross line transition position on the driving substrate 1 may be further reduced, thereby effectively avoiding excessive temperature at the cross line transition position. The risk of components and other wiring near the connection layer 70 being burned may be avoided, and a smaller number of first through holes 51 and second through holes 52 may achieve the same technical effect of dispersing current and reducing voltage drop, thereby reducing the space occupied by first through holes 51 and second through holes 52 on the driving substrate 1, providing more design space for other components or structures.

As shown in FIG. 5, in the present embodiment, each first extension 212 corresponds to one first through hole 51, and each second extension 312 corresponds to one second through-hole 52. The first through-hole 51 and the second through-hole 52 are arranged alternately in a row along the arrangement direction of the first extension 212 and the second extension 312. One first conductive hole 61 and its adjacent second conductive hole 62 form a group of conductive connection holes 60. The adjacent two groups of conductive connection holes 60 may share the first through hole 51 or the second through hole 52, and the length of the intra-group current path of each group of conductive connection holes 60 is equal, thereby achieving the technical effect described above.

As shown in FIG. 6, in the present embodiment, each first extension portion 212 corresponds to multiple first through holes 51, and multiple first through holes 51 are arranged in the same row direction along the extension direction of the first extension portion 212, such that all the first through holes 51 are arranged in multiple rows. Each second extension portion 312 corresponds to multiple second through-holes 52, and the multiple second through-holes 52 are arranged in the same row direction along the extension direction of the second extension portion 312, such that all second through-holes 52 are arranged in multiple rows. The first through holes 51 and the second through holes 52 are arranged alternately in rows, and the second through holes 52 in each row are respectively arranged opposite to the first through holes 51 in an adjacent row. Thus, the first through holes 51 and the second through holes 52 are alternately arranged into multiple columns along the arrangement direction of the first extension portion 212 and the second extension portion 312. One first conductive hole 61 and its adjacent second conductive hole 62 in the same column form a group of conductive connection holes 60, and the adjacent two groups of conductive connection holes 60 in the same column may share one first through hole 51 or one second through hole 52. The length of the intra-group current path of conductive connection holes 60 is equal, thus achieving the technical effects described above.

In the present embodiment, multiple rows of first through holes 51 and multiple rows of second through holes 52 are alternately arranged into an array, such that in each column, the current path from the first through hole 51 to the adjacent second through hole 52 through the connection layer 70 is equal. As a result, the current is evenly distributed on the intra-group current path formed by each group of conductive connection holes 60, thereby reducing current density and voltage drop. At the same time, the first through holes 51 and the second through holes 52 are arranged in an array, thus the current distribution may be further balanced to optimize the current dispersion effect, and the arrangement of the first through holes 51 and the second through holes 52 may be made more compact to reduce the occupied space on the driving substrate 1, providing more space for other structural designs.

In the second embodiment and the third embodiment, both the first through holes 51 and the second through holes 52 are square or rectangular holes, and a pair of opposite lines on the edge of the first through-hole 51 are parallel to the direction of the row of the first through holes 51 in the same row, and a pair of opposite lines on the edge of the second through hole 52 are parallel to the direction of the row of the second through holes 52 in the same row, that is, parallel to the direction of the row of the array, respectively. The other pair of opposite lines on the edge of the first through hole 51 and the other pair of opposite edges on the edge of the second through hole 52 are parallel to the direction of the column of the array, that is, the adjacent edges of the first through hole 51 and the second through hole 52 that are close to each other are parallel to each other. Specifically, the size of the first through holes 51 and the second through holes 52 may be arranged according to practical needs. The shape and size of the first through holes 51 and the shape and size of the second through holes 52 may be arranged to be the same or different, which may also be made according to practical needs. In the present embodiment, the shape and size of the first through holes 51 and the second through holes 52 are the same to facilitate production and reduce process complexity. At the same time, the shape and size of the first through hole 51 and the second through hole 52 are the same, such that the edge of the first through hole 51 near the second through hole 52 and the edge of the second through hole 52 near the first through hole 51 may be aligned at both ends of each group of conductive connection holes 60, thereby increasing the width of the intra-group current path of each group of conductive connection holes 60 and making the current distribution more balanced on the intra-group current path of each group of conductive through holes, further dispersing the current, reducing current density and voltage drop.

Figure 7:
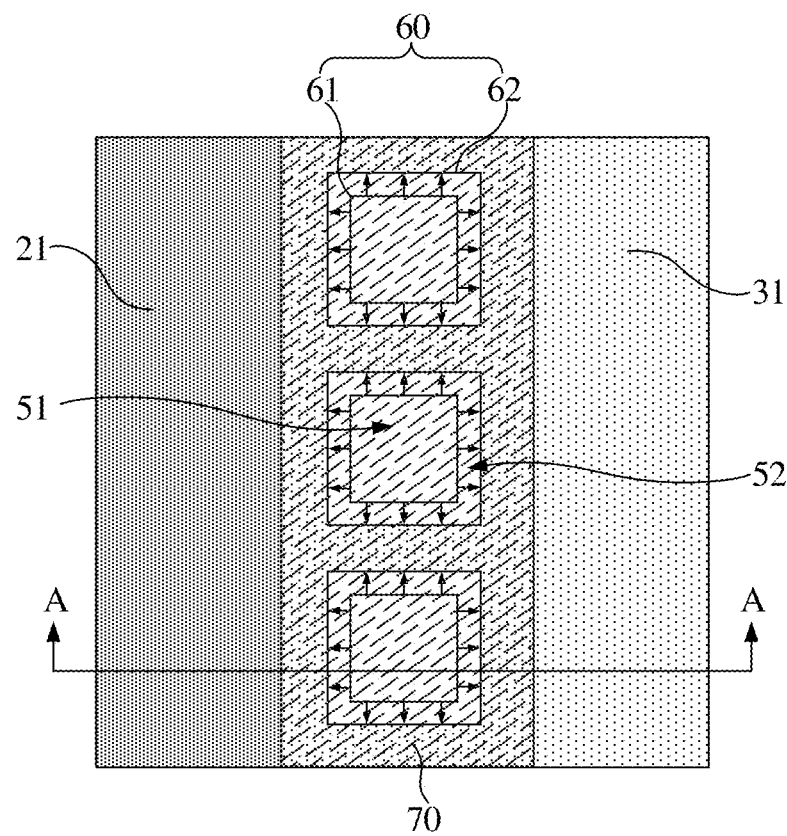
FIG. 7 is a schematic structural view of the arrangement of the conductive connection holes provided in a fourth embodiment of the present disclosure.
Figure 8:
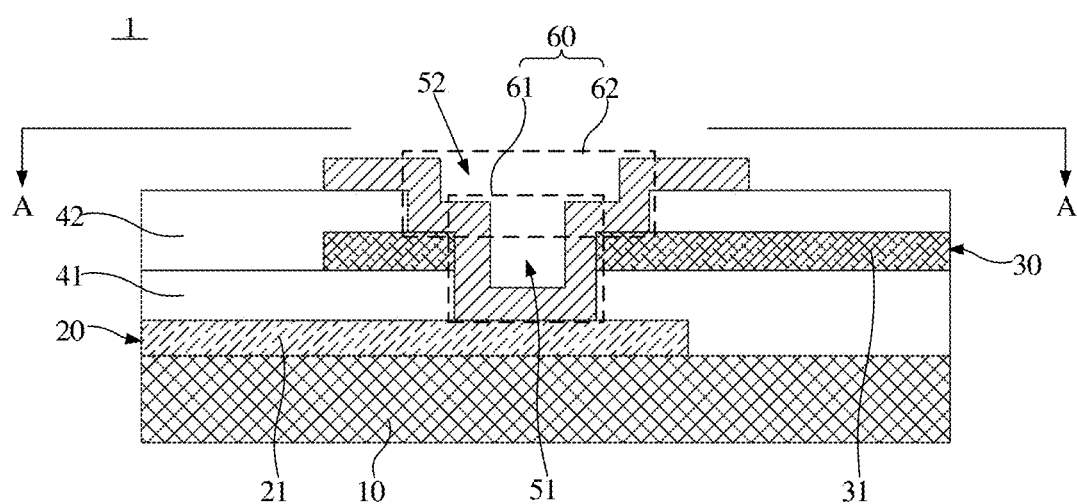
FIG. 8 is a cross-sectional schematic structural view along the A-A direction provided in the embodiment of FIG. 7.

As shown in FIG. 7 and FIG. 8, FIG. 7 is a schematic structural view of the arrangement of the conductive connection holes provided in the fourth embodiment of the present disclosure, and FIG. 8 is a cross-sectional schematic structural view along the A-A direction in the embodiment of FIG. 7. In the present embodiment, a part of the first through hole 51 corresponding to the first wiring 21 overlaps with a part of the second through hole 52 corresponding to the second wiring 31. The first through hole 51 in each group of conductive connection holes 60 is coaxial with the second through-hole 52, and a aperture of the first through hole 51 is smaller than a aperture of the second through hole 52, thereby exposing a part of the second wiring 31, such that the second wiring 31 is electrically connected to the connection layer 70, and in each group of conductive connection holes 60, the length of the intra-group current path is equal at every point on the circumferential direction of the first through hole 51 or the second through hole 52. As a result, the current is evenly distributed along the circumferential direction of the first through hole 51 or the second through hole 52 on the intra-group current path of conductive connection holes 60 in each group, such that there is current distributed uniformly on the circumferential direction of the first through hole 51 and the second through hole 52, which may further disperse the current, reduce current density, and reduce voltage drop. Moreover, the current transmission efficiency of the first through hole 51 and the second through hole 52 is further improved. Moreover, by coaxially arranging the first through hole 51 and the second through hole 52, the length of the current path from the first conductive hole 61 in each group of conductive connection holes 60 to the second conductive hole 62 through the connection layer 70 may be further effectively reduced, which greatly reduces the intra-group current path of each group of conductive connection holes 60, further reducing the load on the current transmission path, and thus further reducing the voltage drop. In addition, by arranging the first through hole 51 and the second through hole 52 coaxially may further effectively reduce the space occupied by the through holes on the driving substrate 1, providing more design space for other structures.

Specifically, the first through hole 51 and the second through hole 52 are square or circular holes, and the edge lines of the first through hole 51 and the edge lines of the second through hole 52 are parallel to each other. It should be noted that the edge lines of the first through hole 51 and the edge lines of the second through hole 52 are parallel to each other means that: when the first through hole 51 and the second through hole 52 are square holes, the edge lines of the first through hole 51 and the second through hole 52 both include four lines. The four edge lines of the first through hole 51 are opposite and parallel to the four edge lines of the second through hole 52, respectively. When the first through hole 51 and the second through hole 52 are circular holes, the edge line of the first through hole 51 and the second through hole 52 are both circular. The circular edge line of the first through hole 51 is opposite and parallel to the circular edge line of the second through hole 52, which may be understood as the projection of the edge line of the first through hole 51 and the projection of the edge line of the second through hole 52 on the base 10 is a concentric circle. By making the edge lines of the first through hole 51 parallel to the edge lines of the second through hole 52, the length of the intra-group current path of the conductive connection holes 60 is equal at every point in the circumferential direction of the first through hole 51 or the second through hole 52, such that the current is evenly distributed along the circumferential direction of the first through hole 51 or the second through hole 52 on the intra-group current path of each group of the conductive connection holes 60. Thus, the first through hole 51 and the second through hole 52 have a circumferential distribution of current.

Figure 9:
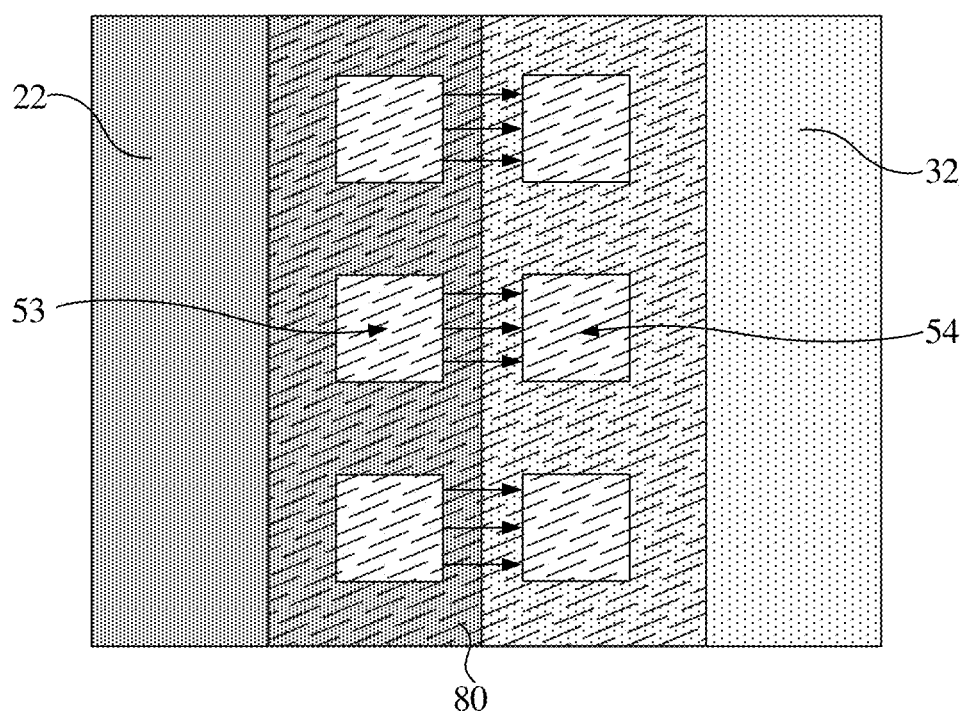
FIG. 9 is a schematic structural view of the arrangement of conductive connection holes provided in a fourth comparative embodiment of the present disclosure.

As shown in FIG. 9, FIG. 9 is a schematic structural view of the arrangement of the conductive through holes provided in the fourth comparative embodiment of the present disclosure. In the fourth comparative embodiment, the fourth through hole 54 is located on one side of the third through hole 53. During current transmission, current is transmitted from the third through hole 53 along the connection layer 80 to the fourth through hole 54 to achieve cross line connection. It is easy to see that compared to the fourth comparative embodiment, the length of the current transmission path in the fourth embodiment is shorter, so the voltage drop is smaller, and the current is more evenly distributed in the circumferential direction of the first conductive hole 61 and the second conductive hole 62. And compared to the fourth comparative embodiment, the current transmission efficiency of the conductive connection hole 60 is higher, and when achieving the same size of current transmission, fewer through holes are required in the fourth embodiment.

Figure 10:
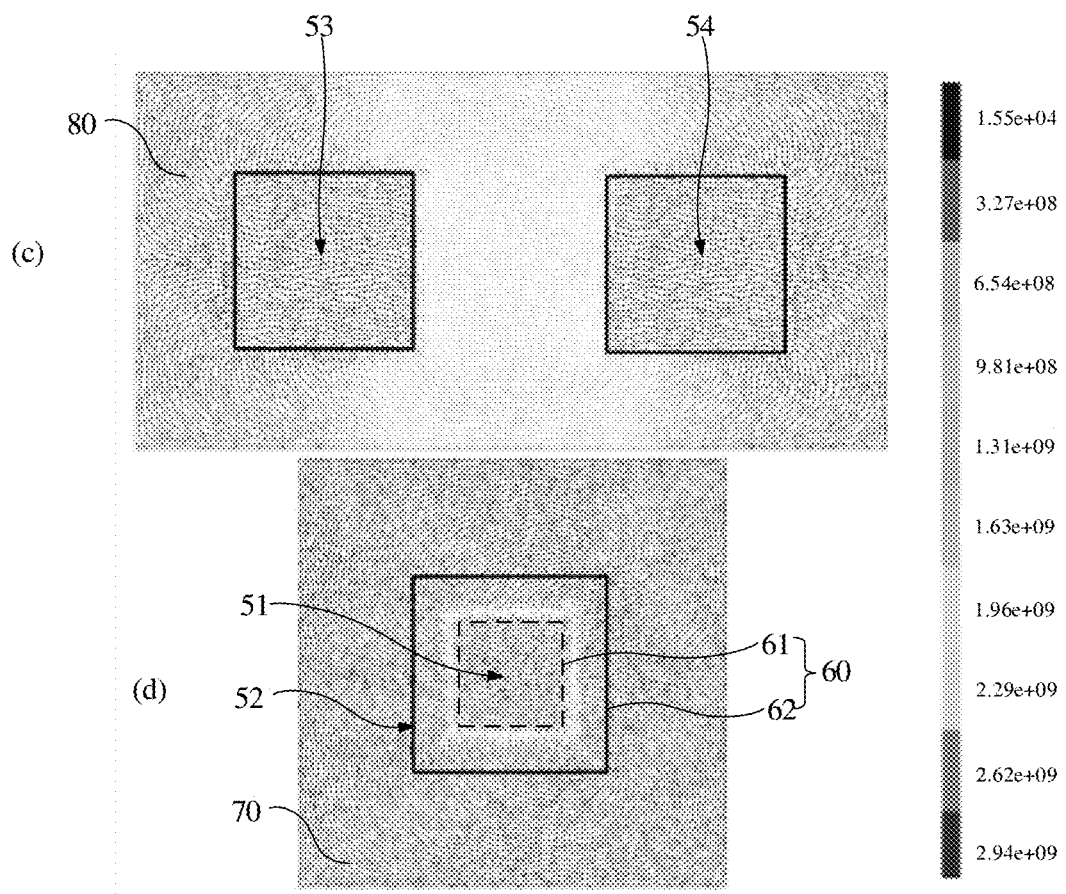
FIG. 10 is a simulation view of the current distribution in the fourth comparative embodiment and a fourth embodiment of the present disclosure; FIG. (c) is a simulation view of the current distribution in the fourth comparative embodiment of the present disclosure; FIG. (d) is a simulation view of the current distribution in the fourth embodiment of the present disclosure.

As shown in FIG. 10, FIG. 10 is a simulation view of the current distribution in the fourth comparative embodiment and a simulation view of the current distribution in the fourth embodiment of the present disclosure. Among them, FIG. (c) is the simulation view of the current distribution in the fourth comparative embodiment of the present disclosure, and FIG. (d) is the simulation view of the current distribution in the fourth embodiment of the present disclosure. In the fourth comparative embodiment, a third through hole 53 and a fourth through hole 54 are taken as an example. In the fourth embodiment, a first through hole 51 and a second through hole 52 are used as an example for simulation. During the simulation, the same amount of current is applied in the fourth comparative embodiment and the fourth embodiment, respectively. From the simulation results in the FIG. 10, it may be seen that the current in the fourth embodiment is more evenly distributed in the first through hole 51 and the second through hole 52, the current density is relatively small, and the current transmission path length is shorter compared to the fourth comparative embodiment, thereby reducing the load on the transmission path to a greater extent and thereby reducing the voltage drop to a large extent. This may effectively avoid excessive temperature and reduce the risk of burning out the connection layer 70 or other wiring, components, etc. near this location.

As shown in FIG. 11, FIG. 11 is a schematic structural view of the display device provided in an embodiment of the present disclosure. In the present embodiment, a display device 100 is provided for displaying images. The display device 100 may be used in the display field. Specifically, the display device 100 includes a light emitting unit 2 and a driving substrate 1.

The light emitting unit 2 is used for displaying images, and the light emitting unit 2 includes a current driven light emitting element 201, such as a light emitting diode (LED), a micro light emitting diode (Micro LED), a mini light emitting diode (Mini LED), and an organic light emitting diode (OLED), etc.

The driving substrate 1 is electrically connected to the light emitting unit 2 to provide a driving signal to the light emitting unit 2 and enable the light emitting unit 2 to display image. Specifically, the specific structure and function of the driving substrate 1 are the same or similar to those of the driving substrate 1 mentioned in the above embodiments, and may achieve the same technical effect, the previous introduction may be referred for details, and will not be elaborated herein. The current distribution on the driving substrate 1 is more balanced on the transmission path, which may effectively reduce the current density and increase the width and length of the current transmission path, thereby reducing the load on the current signal transmission path and effectively reducing the voltage drop. Moreover, it not only effectively avoids excessive temperature, but also reduces the risk of burning out the connection layer 70 or other wiring, components, etc. near this location. In addition, it may also enhance the image display brightness of the light emitting unit 2 and reduce the power consumption of the display device 100.

A driving substrate according to an embodiment of the present disclosure includes a base, a first metal layer, a first insulation layer, a second metal layer, a second insulation layer, and an connection layer. The first metal layer is arranged on one side of the base, and the first metal layer includes a first wiring. The first insulation layer is arranged on one side of the first metal layer away from the base and covers the first metal layer. The second metal layer is arranged on one side of the first insulation layer away from the base, and the second metal layer includes a second wiring. The second insulation layer is arranged on one side of the second metal layer away from the base and covers the second metal layer. The first insulation layer and the second insulation layer define a first through hole to expose a part of the first wiring. The second insulation layer defines a second through hole to expose a part of the second wiring. The connection layer is arranged on one side of the second insulation layer away from the base. A part of the connection layer extends into the first through hole to form a first conductive hole, and another part of the connection layer extends into the second through hole to form a second conductive hole to allow the electrical connection of the first wiring and second wiring through the connection layer. One first conductive hole and one second conductive hole form a group of conductive connection holes. The driving substrate includes multiple groups of conductive connection holes, each group of conductive connection holes having an intra-group current path and an extra-group path. In each group of conductive connection holes, the current path formed by the first conductive hole passing through the connection layer to the corresponding second conductive hole is the intra-group current path. In any group of the conductive connection holes, the current path formed by the first conductive hole passing through the connection layer to the second conductive hole of the other group of conductive connection holes is the extra-group path. The length of the intra-group current path in each group of conductive connection holes is smaller than the length of the extra-group path. And the length of the intra-group current path of one group of conductive connection holes is equal to the length of the intra-group current path of any other group of conductive connection holes.

In some embodiments, the first wiring includes a first body portion and a first extension portion, wherein one end of the first extension portion is connected to the first body portion, the first extension portion corresponds to multiple first through holes, and the multiple first through holes are arranged in line along the extension direction of the first extension portion. The second wiring includes a second body portion and a second extension portion, wherein one end of the second extension portion is connected to the second body portion; a projection of the second extension portion on the first metal layer is staggered with the first extension portion; the second extension portion corresponds to multiple second through holes, the multiple second through holes are arranged in line along the extension direction of the second extension portion and are respectively aligned with the first through holes, and each second through hole corresponds to each first through hole one by one, such that each first conductive hole and the corresponding second conductive hole form a group of conductive connection holes, and the length of the intra-group current path of each group of conductive connection holes is equal.

In some embodiments, the multiple first through holes are arranged in a same row direction along the extension direction of the first extension portion, the multiple second through holes are arranged in a same row direction along the extension direction of the second extension portion, and the multiple first through holes and the multiple second through holes are arranged in an array, such that the second conductive hole located in the same column corresponds to the first conductive hole to form a group of conductive connection holes in the column direction of the array.

In some embodiments, the first wiring includes a first body portion and multiple spaced first extension portions, one end of the first extension portion is connected to the first body portion, and each first extension portion corresponds to at least one first through hole. The second wiring includes a second body portion and multiple spaced second extension portions, one end of the second extension portion is connected to the second body portion, and the projection of the second extension portion on the first metal layer is staggered and alternately arranged with the first extension portion; each second extension portion corresponds to at least one second through hole, the first through hole and the second through hole are alternately arranged along the arrangement direction of the first extension portion and second extension portion to form at least one column; one first conductive hole and an adjacent second conductive hole in the same column form a group of conductive connection holes, and the length of the intra-group current path of each group of conductive connection holes is equal.

In some embodiments, each first extension portion corresponds to multiple first through holes, and the multiple first through holes are arranged in a same row direction along the extension direction of the first extension portion; each second extension portion corresponds to multiple second through holes, the multiple second through holes are arranged in a same row direction along the extension direction of the second extension portion, and the multiple second through holes in one row are opposite to the multiple first through holes in an adjacent row respectively, such that the first through holes and the second through holes are alternately arranged into multiple columns along the arrangement direction of the first extension portion and the second extension portion; the first conductive hole and an adjacent second conductive hole in the same column form a group of conductive connection holes, and the adjacent two groups of conductive connection holes in the same column share one first through hole or one second through hole.

In some embodiments, multiple rows of the first through holes and multiple rows of the second through holes are alternately arranged into an array, such that in each column of the array, the current path from the first through hole to the adjacent second through hole through the connection layer is equal.

In some embodiments, both the first through hole and the second through hole are square or rectangular holes, and a pair of opposite lines at the edge of the first through hole are parallel to the direction of the row of the first through holes in the same row, and a pair of opposite lines at the edge of the second through hole are parallel to the direction of the row of the second through holes in the same row.

In some embodiments, both the first through hole and the second through hole are square or rectangular holes, and a pair of opposite lines at the edge of the first through hole are parallel to the direction of the row of the first through holes in the same row, and a pair of opposite lines at the edge of the second through hole are parallel to the direction of the row of the second through holes in the same row.

In some embodiments, a part of the first wiring corresponding to the first through hole overlaps with a part of the second wiring corresponding to the second through hole, and the first through hole in each group of conductive connection holes is coaxial with the corresponding second through hole, such that the current along the circumference of the first through hole or the second through hole on the intra-group current path of conductive connection holes is evenly distributed.

In some embodiments, the first through hole and the second through hole are square or circular holes, and the edge lines of the first through hole and the edge lines of the second through hole are parallel to each other.

In some embodiments, a display device includes a light emitting unit for displaying images and a driving substrate. The light emitting unit includes a current driven light emitting element. The driving substrate according to an embodiment of the present disclosure includes a base, a first metal layer, a first insulation layer, a second metal layer, a second insulation layer, and a connection layer. The first metal layer is arranged on one side of the base, and the first metal layer includes a first wiring. The first insulation layer is arranged on one side of the first metal layer away from the base and covers the first metal layer. The second metal layer is arranged on one side of the first insulation layer away from the base, and the second metal layer includes a second wiring. The second insulation layer is arranged on one side of the second metal layer away from the base and covers the second metal layer. The first insulation layer and the second insulation layer define a first through hole to expose a part of the first wiring. The second insulation layer defines a second through hole to expose a part of the second wiring. The connection layer is arranged on one side of the second insulation layer away from the base. A part of the connection layer extends into the first through hole to form a first conductive hole, and another part of the connection layer extends into the second through hole to form a second conductive hole to allow the electrical connection of the first wiring and second wiring through the connection layer. One first conductive hole and one second conductive hole form a group of conductive connection holes. The driving substrate includes multiple groups of conductive connection holes, each group of conductive connection holes having an intra-group current path and an extra-group path. In each group of conductive connection holes, the current path formed by the first conductive hole passing through the connection layer to the corresponding second conductive hole is the intra-group current path. In any group of the conductive connection holes, the current path formed by the first conductive hole passing through the connection layer to the second conductive hole of the other group of conductive connection holes is the extra-group path. The length of the intra-group current path in each group of conductive connection holes is smaller than the length of the extra-group path. The length of the intra-group current path of one group of conductive connection holes is equal to the length of the intra-group current path of any other group of conductive connection holes. The driving substrate is electrically connected to the light emitting unit, for providing a driving signal to the light emitting unit.

The above is only the implementation method of the present disclosure and does not limit the patent scope of the present disclosure. Any equivalent structure or equivalent process transformation made by using the description and accompanying drawings of the present disclosure, or directly or indirectly applied in other related technical fields, are equally included in the patent protection scope of the present disclosure.

What is claimed is:

1. A driving substrate, comprising:
   a base;
   a first metal layer, arranged on one side of the base, wherein the first metal layer comprises a first wiring;
   a first insulation layer, arranged on one side of the first metal layer away from the base and covering the first metal layer;
   a second metal layer, arranged on one side of the first insulation layer away from the base, wherein the second metal layer comprises a second wiring;
   a second insulation layer, arranged on one side of the second metal layer away from the base and covering the second metal layer; wherein the first insulation layer and the second insulation layer define a first through hole to expose a part of the first wiring; and the second insulation layer defines a second through hole to expose a part of the second wiring;
   a connection layer, arranged on one side of the second insulation layer away from the base, wherein a part of the connection layer extends into the first through hole to form a first conductive hole, and another part of the connection layer extends into the second through hole to form a second conductive hole to allow the electrical connection of the first wiring and the second wiring through the connection layer; and one first conductive hole and one second conductive hole form a group of conductive connection holes;
   wherein, the driving substrate comprises multiple groups of conductive connection holes, each group of conductive connection holes have an intra-group current path and an extra-group path; in each group of the conductive connection holes, a current path formed by the first conductive hole passing through the connection layer to the corresponding second conductive hole is the intra-group current path; a current path formed by the first conductive hole in one group of conductive connection holes passing through the connection layer to the second conductive hole in any other group of conductive connection holes is the extra-group path; and
   wherein the length of the intra-group current path of the conductive connection hole is smaller than the length of the extra-group current path in each group; and the length of the intra-group current path of one group of conductive connection holes is equal to the length of the intra-group current path of any other group of conductive connection holes.

2. The driving substrate according to claim 1, wherein a part of the first wiring corresponding to the first through hole overlaps with a part of the second wiring corresponding to the second through hole, and the first through hole in each group of conductive connection holes is coaxial with the corresponding second through hole, such that the current along the circumference of the first through hole or the second through hole on the intra-group current path of conductive connection holes is evenly distributed.

3. The driving substrate according to claim 2, wherein the first through hole and the second through hole are square or circular holes, and the edge lines of the first through hole and the edge lines of the second through hole are parallel to each other.

4. The driving substrate according to claim 1, wherein the first wiring comprises a first body portion and a first extension portion, wherein one end of the first extension portion is connected to the first body portion, the first extension portion corresponds to multiple first through holes, and the multiple first through holes are arranged in line along the extension direction of the first extension portion; and the second wiring comprises a second body portion and a second extension portion, wherein one end of the second extension portion is connected to the second body portion; a projection of the second extension portion on the first metal layer is staggered with the first extension portion; the second extension portion corresponds to multiple second through holes, the multiple second through holes are arranged in line along the extension direction of the second extension portion and are respectively aligned with the first through holes, and each second through hole corresponds to each first through hole one by one, such that each first conductive hole and the corresponding second conductive hole form a group of conductive connection holes, and the length of the intra-group current path of each group of conductive connection holes is equal.

5. The driving substrate according to claim 4, wherein the multiple first through holes are arranged in a same row direction along the extension direction of the first extension portion, the multiple second through holes are arranged in a same row direction along the extension direction of the second extension portion, and the multiple first through holes and the multiple second through holes are arranged in an array, such that the second conductive hole located in the same column corresponds to the first conductive hole to form a group of conductive connection holes in the column direction of the array.

6. The driving substrate according to claim 5, Wherein both the first through hole and the second through hole are square or rectangular holes, and a pair of opposite lines at the edge of the first through hole are parallel to the direction of the row of the first through holes in the same row, and a pair of opposite lines at the edge of the second through hole are parallel to the direction of the row of the second through holes in the same row.

7. The driving substrate according to claim 1, wherein the first wiring comprises a first body portion and multiple spaced first extension portions, one end of the first extension portion is connected to the first body portion, and each first extension portion corresponds to at least one first through hole; and the second wiring includes a second body portion and multiple spaced second extension portions, one end of the second extension portion is connected to the second body portion, and the projection of the second extension portion on the first metal layer is staggered and alternately arranged with the first extension portion; each second extension portion corresponds to at least one second through hole, the first through hole and the second through hole are alternately arranged along the arrangement direction of the first extension portion and second extension portion to form at least one column; one first conductive hole and an adjacent second conductive hole in the same column form a group of conductive connection holes, and the length of the intra-group current path of each group of conductive connection holes is equal.

8. The driving substrate according to claim 7, wherein each first extension portion corresponds to multiple first through holes, and the multiple first through holes are arranged in a same row direction along the extension direction of the first extension portion; each second extension portion corresponds to multiple second through holes, the multiple second through holes are arranged in a same row direction along the extension direction of the second extension portion, and the multiple second through holes in one row are opposite to the multiple first through holes in an adjacent row respectively, such that the first through holes and the second through holes are alternately arranged into multiple columns along the arrangement direction of the first extension portion and the second extension portion; the first conductive hole and an adjacent second conductive hole in the same column form a group of conductive connection holes, and the adjacent two groups of conductive connection holes in the same column share one first through hole or one second through hole.

9. The driving substrate according to claim 8, wherein multiple rows of the first through holes and multiple rows of the second through holes are alternately arranged into an array, such that in each column of the array, the current path from the first through hole to the adjacent second through hole through the connection layer is equal.

10. The driving substrate according to claim 8, wherein both the first through hole and the second through hole are square or rectangular holes, and a pair of opposite lines at the edge of the first through hole are parallel to the direction of the row of the first through holes in the same row, and a pair of opposite lines at the edge of the second through hole are parallel to the direction of the row of the second through holes in the same row.

11. A display device, comprising:
a light emitting unit for displaying images, wherein the light emitting unit comprises a current driven light emitting element;
a driving substrate, wherein the driving substrate comprises:
a base;
a first metal layer, arranged on one side of the base, wherein the first metal layer comprises a first wiring;
a first insulation layer, arranged on one side of the first metal layer away from the base and covering the first metal layer;
a second metal layer, arranged on one side of the first insulation layer away from the base, wherein the second metal layer comprises a second wiring;
a second insulation layer, arranged on one side of the second metal layer away from the base and covering the second metal layer; wherein the first insulation layer and the second insulation layer define a first through hole to expose a part of the first wiring; and the second insulation layer defines a second through hole to expose a part of the second wiring;
a connection layer, arranged on one side of the second insulation layer away from the base, wherein a part of the connection layer extends into the first through hole to form a first conductive hole, and another part of the connection layer extends into the second through hole to form a second conductive hole to allow the electrical connection of the first wiring and the second wiring through the connection layer; and one first conductive hole and one second conductive hole form a group of conductive connection holes;
the driving substrate comprises multiple groups of conductive connection holes, each group of conductive connection holes have an intra-group current path and an extra-group path;
in each group of the conductive connection holes, a current path formed by the first conductive hole passing through the connection layer to the corresponding second conductive hole is the intra-group current path;

a current path formed by the first conductive hole in one group of conductive connection holes passing through the connection layer to the second conductive hole in any other group of conductive connection holes is the extra-group path;

wherein the length of the intra-group current path of the conductive connection hole is smaller than the length of the extra-group current path in each group and the length of the intra-group current path of one group of conductive connection holes is equal to the length of the intra-group current path of any other group of conductive connection holes; and the driving substrate is electrically connected to the light emitting unit, for providing a driving signal to the light emitting unit.

12. The display device according to claim 11, wherein a part of the first wiring corresponding to the first through hole overlaps with a part of the second wiring corresponding to the second through hole, and the first through hole in each group of conductive connection holes is coaxial with the corresponding second through hole, such that the current along the circumference of the first through hole or the second through hole on the intra-group current path of conductive connection holes is evenly distributed.

13. The display device according to claim 12, wherein the first through hole and the second through hole are square or circular holes, and the edge lines of the first through hole and the edge lines of the second through hole are parallel to each other.

14. The display device according to claim 11, wherein the first wiring comprises a first body portion and a first extension portion, wherein one end of the first extension portion is connected to the first body portion, the first extension portion corresponds to multiple first through holes, and the multiple first through holes are arranged in line along the extension direction of the first extension portion; and the second wiring comprises a second body portion and a second extension portion, wherein one end of the second extension portion is connected to the second body portion; a projection of the second extension portion on the first metal layer is staggered with the first extension portion; the second extension portion corresponds to multiple second through holes, the multiple second through holes are arranged in line along the extension direction of the second extension portion and are respectively aligned with the first through holes, and each second through hole corresponds to each first through hole one by one, such that each first conductive hole and the corresponding second conductive hole form a group of conductive connection holes, and the length of the intra-group current path of each group of conductive connection holes is equal.

15. The display device according to claim 14, wherein the multiple first through holes are arranged in a same row direction along the extension direction of the first extension portion, the multiple second through holes are arranged in a same row direction along the extension direction of the second extension portion, and the multiple first through holes and the multiple second through holes are arranged in an array, such that the second conductive hole located in the same column corresponds to the first conductive hole to form a group of conductive connection holes in the column direction of the array.

16. The display device according to claim 15, Wherein both the first through hole and the second through hole are square or rectangular holes, and a pair of opposite lines at the edge of the first through hole are parallel to the direction of the row of the first through holes in the same row, and a pair of opposite lines at the edge of the second through hole are parallel to the direction of the row of the second through holes in the same row.

17. The display device according to claim 11, wherein the first wiring comprises a first body portion and multiple spaced first extension portions, one end of the first extension portion is connected to the first body portion, and each first extension portion corresponds to at least one first through hole; and the second wiring includes a second body portion and multiple spaced second extension portions, one end of the second extension portion is connected to the second body portion, and the projection of the second extension portion on the first metal layer is staggered and alternately arranged with the first extension portion; each second extension portion corresponds to at least one second through hole, the first through hole and the second through hole are alternately arranged along the arrangement direction of the first extension portion and second extension portion to form at least one column; one first conductive hole and an adjacent second conductive hole in the same column form a group of conductive connection holes, and the length of the intra-group current path of each group of conductive connection holes is equal.

18. The display device according to claim 17, wherein each first extension portion corresponds to multiple first through holes, and the multiple first through holes are arranged in a same row direction along the extension direction of the first extension portion; each second extension portion corresponds to multiple second through holes, the multiple second through holes are arranged in a same row direction along the extension direction of the second extension portion, and the multiple second through holes in one row are opposite to the multiple first through holes in an adjacent row respectively, such that the first through holes and the second through holes are alternately arranged into multiple columns along the arrangement direction of the first extension portion and the second extension portion; the first conductive hole and an adjacent second conductive hole in the same column form a group of conductive connection holes, and the adjacent two groups of conductive connection holes in the same column share one first through hole or one second through hole.

19. The display device according to claim 18, wherein multiple rows of the first through holes and multiple rows of the second through holes are alternately arranged into an array, such that in each column of the array, the current path from the first through hole to the adjacent second through hole through the connection layer is equal.

20. The display device according to claim 18, Wherein both the first through hole and the second through hole are square or rectangular holes, and a pair of opposite lines at the edge of the first through hole are parallel to the direction of the row of the first through holes in the same row, and a pair of opposite lines at the edge of the second through hole are parallel to the direction of the row of the second through holes in the same row.

* * * * *